US012101989B2

(12) United States Patent
Park et al.

(10) Patent No.: US 12,101,989 B2
(45) Date of Patent: Sep. 24, 2024

(54) STRETCHABLE DISPLAY DEVICE (71) Applicant: SAMSUNG DISPLAY CO., LTD., Yongin-si (KR)

(72) Inventors: Gyung Soon Park, Seoul (KR); Jae Min Shin, Suwon-si (KR); Junki Jeong, Anyang-si (KR); Hyejin Joo, Suwon-si (KR); Jongho Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 388 days.

(21) Appl. No.: 17/648,550

(22) Filed: Jan. 21, 2022

(65) Prior Publication Data

US 2022/0140264 A1 May 5, 2022

Related U.S. Application Data (63) Continuation of application No. 16/690,916, filed on Nov. 21, 2019, now Pat. No. 11,264,578.

(30) Foreign Application Priority Data

Nov. 28, 2018 (KR) .................. 10-2018-0149557

(51) Int. Cl.
*H10K 77/10* (2023.01)
*G09F 9/30* (2006.01)
(Continued)

(52) U.S. Cl.
CPC ............ *H10K 77/111* (2023.02); *G09F 9/301* (2013.01); *H05K 1/0283* (2013.01); *H10K 50/80* (2023.02); *H10K 59/12* (2023.02); *H10K 59/131* (2023.02)

(58) Field of Classification Search
CPC ...... H10K 77/111; H10K 50/80; H10K 59/12; H10K 59/131; H10K 59/80; G09F 9/301;
(Continued)

(56) References Cited

U.S. PATENT DOCUMENTS 8,217,381 B2  7/2012  Rogers et al.
8,552,299 B2  10/2013 Rogers et al.
(Continued)

FOREIGN PATENT DOCUMENTS

JP   2003-195773 A2   7/2003
KR   10-2016-0042288  4/2016
(Continued)

OTHER PUBLICATIONS

Office Action issued in corresponding Chinese Patent Application No. 201911167037.2 dated Jun. 7, 2024.

*Primary Examiner* — J. E. Schoenholtz
(74) *Attorney, Agent, or Firm* — F. Chau & Associates, LLC (57) ABSTRACT A stretchable display device includes a display area having stretchable display units each including first islands on which pixels are disposed and first cut-out grooves between the first islands. A peripheral area is adjacent to the display area, the peripheral area includes stretchable peripheral units each including first lines on which driving circuits are disposed and first opening portions between the first lines. A buffer area is disposed between the display area and the peripheral area. The buffer area includes stretchable buffer units each including second islands, second cut-out grooves between the second islands, second lines connected to the second islands, and second opening portions between the second lines. Shapes of the second cut-out grooves may be (Continued)

different from shapes of the first cut-out grooves, and shapes of the second opening portions may be different from shapes of the first opening portions.

16 Claims, 10 Drawing Sheets

(51) Int. Cl.
    *H05K 1/02*         (2006.01)
    *H10K 50/80*       (2023.01)
    *H10K 59/12*       (2023.01)
    *H10K 59/131*     (2023.01)

(58) Field of Classification Search
    CPC ... H05K 1/0283; Y02E 10/549; G06F 1/1616; G06F 1/1641; G06F 1/1652
    See application file for complete search history.

(56) References Cited

U.S. PATENT DOCUMENTS

| | | | |
|---|---|---|---|
| 8,729,524 | B2 | 5/2014 | Rogers et al. |
| 9,391,286 | B1 | 7/2016 | Kwon et al. |
| 9,619,058 | B2 | 4/2017 | Park et al. |
| 9,706,647 | B2 | 7/2017 | Hsu et al. |
| 9,756,723 | B2 | 9/2017 | Hong et al. |
| 9,853,246 | B2 | 12/2017 | Kwon |
| 9,894,734 | B2 | 2/2018 | Kim |
| 10,310,560 | B2 | 6/2019 | Choi et al. |
| 11,264,578 | B2 * | 3/2022 | Park ................. H10K 50/80 |
| 2006/0169989 | A1 | 8/2006 | Bhattacharya et al. |
| 2013/0041235 | A1 | 2/2013 | Rogers et al. |
| 2016/0190223 | A1 | 6/2016 | Park et al. |
| 2018/0120997 | A1 | 5/2018 | Moon et al. |
| 2020/0168824 | A1 | 5/2020 | Park et al. |
| 2020/0243778 | A1 | 7/2020 | Li |

FOREIGN PATENT DOCUMENTS

| | | |
|---|---|---|
| KR | 10-2017-0113934 | 10/2017 |
| KR | 10-1810050 | 12/2017 |
| KR | 10-2300641 | 9/2021 |
| KR | 10-2327582 | 11/2021 |
| KR | 10-2366697 | 1/2022 |
| KR | 10-2456698 | 10/2022 |

\* cited by examiner

STRETCHABLE DISPLAY DEVICE

CROSS-REFERENCE TO RELATED APPLICATION(S)

This application is a Continuation of co-pending U.S. patent application Ser. No. 16/690,916, filed on Nov. 21, 2019, which claims priority under 35 USC § 119 to Korean Patent Application No. 10-2018-0149557, filed on Nov. 28, 2018 in the Korean Intellectual Property Office (KIPO), the entire disclosures of which are incorporated by reference herein.

TECHNICAL FIELD

The present disclosure relates to a display device and, more particularly, to a stretchable display device.

DISCUSSION OF THE RELATED ART

Traditionally, the display surfaces of display devices are flat and solid. However, modern display devices may be curved or flexible.

A flexible display device may have the ability to be bent and unbent without cracking or breaking. The flexible display devices may be deformed in various way. The flexible display devices may include foldable display devices and/or bendable display devices, which deform in a portion of a display surface, and may include rollable display devices, which deform an entirety of a display surface. The flexible display devices may further include stretchable display devices.

Since the flexible display devices may be deformed in various way, a significant amount of deformation may result in physical damage to the display device due to accumulation of stress.

SUMMARY

A stretchable display device includes a stretchable display area having a plurality of stretchable display units. Each of the plurality of stretchable display units includes a plurality of first islands on which a plurality of pixels are respectively disposed and a plurality of first cut-out grooves formed between the first islands. A stretchable first peripheral area extends primarily in a first direction from the display area. The stretchable first peripheral area includes a plurality of stretchable peripheral units. Each of the plurality of stretchable peripheral units includes a plurality of first lines on which a plurality of driving circuits are respectively disposed and a plurality of first opening portions formed between the first lines. A stretchable buffer area is disposed between the display area and the stretchable first peripheral area. The stretchable buffer area includes a plurality of stretchable buffer units. The stretchable buffer units each include a plurality of second islands, a plurality of second cut-out grooves formed between the second islands, a plurality of second lines respectively connected to the second islands, and a plurality of second opening portions formed between the second lines. A shape of each of the second cut-out grooves is different from a shape of each of the first cut-out grooves. A shape of each of the second opening portions is different from a shape of each of the first opening portions.

A stretchable display device includes a stretchable display area having a plurality of stretchable display units. The stretchable display units each include a plurality of first islands on which a plurality of pixels are respectively disposed and a plurality of first bridges connecting the first islands. A stretchable first peripheral area extends primarily in a first direction from the display area. The stretchable first peripheral area includes a plurality of stretchable peripheral units. The stretchable peripheral units each include a plurality of first lines on which a plurality of driving circuits are respectively disposed and a plurality of first connecting portions connecting the first lines. A stretchable buffer area is disposed between the display area and the stretchable first peripheral area. The stretchable buffer area includes a plurality of stretchable buffer units. The stretchable buffer units each include a plurality of second islands, a plurality of second bridges connecting the second islands, a plurality of second lines respectively connected to the second islands, and a plurality of second connecting portions connecting the second lines. A shape of each of the second islands is different from a shape of each of the first islands. A shape of each of the second lines is different from a shape of each of the first lines.

A stretchable display device includes a display area having a plurality of stretchable display units. A stretchable peripheral area extends primarily in a first direction from the display area. The stretchable peripheral area includes a plurality of stretchable peripheral units. The stretchable peripheral units each have a shape different from each of the stretchable display units. A stretchable buffer area is disposed between the display area and the stretchable peripheral area. The stretchable buffer area includes a plurality of stretchable buffer units, each of the stretchable buffer units each having a shape different from each of the stretchable display units and each of the stretchable peripheral units.

BRIEF DESCRIPTION OF THE DRAWINGS

A more complete appreciation of the present disclosure and many of the attendant aspects thereof will be more clearly understood from the following detailed description taken in conjunction with the accompanying drawings, wherein.

DETAILED DESCRIPTION OF THE EMBODIMENTS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. Hereinafter, stretchable display devices in accordance with exemplary embodiments of the present disclosure will be explained in detail with reference to the accompanying drawings.

Figure 1:
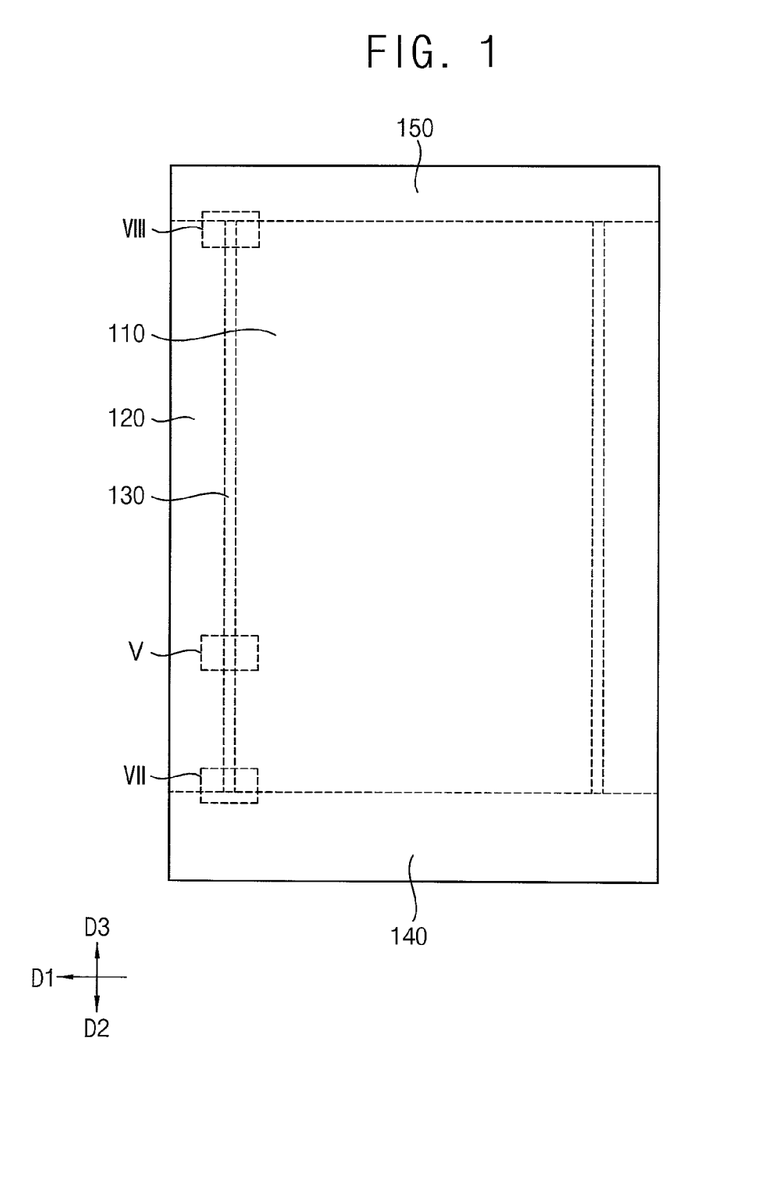
FIG. 1 is a plan view illustrating a stretchable display device according to an exemplary embodiment of the present disclosure.

FIG. 1 is a plan view illustrating a stretchable display device according to an exemplary embodiment of the present disclosure.

Referring to FIG. 1, a stretchable display device, according to an exemplary embodiment of the present disclosure, may include a display area 110, a first peripheral area 120, a buffer area 130, a second peripheral area 140, and a third peripheral area 150. The stretchable display device may be configured to be expanded or contracted by external force without forming cracks or other defects.

Figure 2:
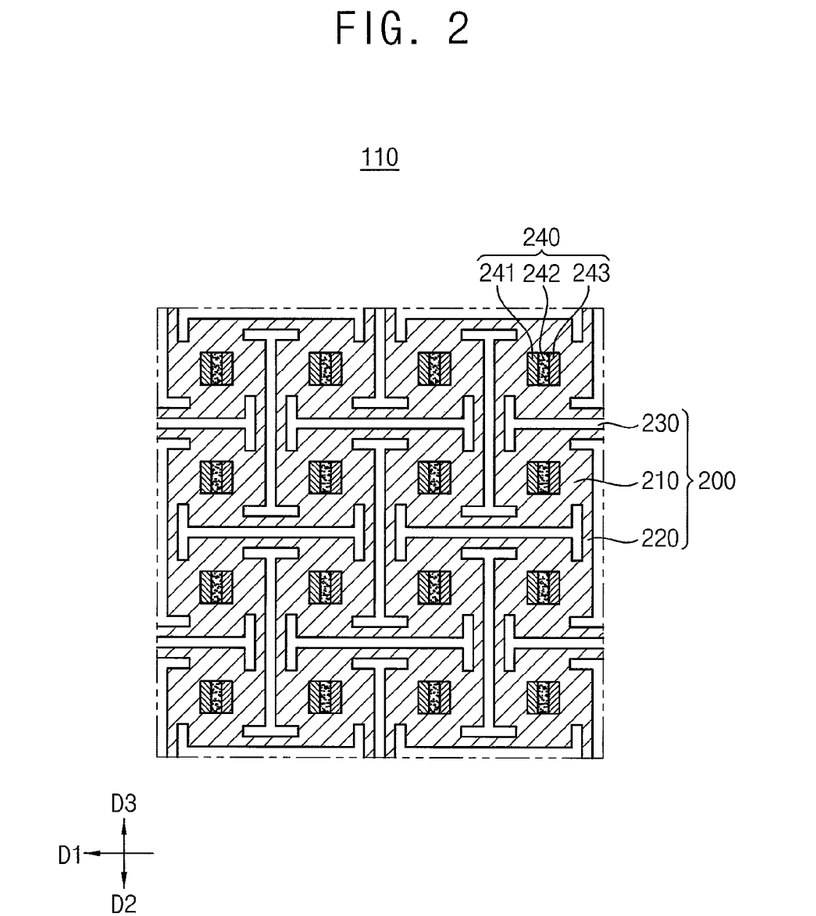
FIG. 2 is a plan view illustrating a display area in the stretchable display device of FIG. 1.

FIG. 2 is a plan view illustrating the display area 110 in the stretchable display device of FIG. 1.

Referring to FIGS. 1 and 2, a plurality of pixels 240 may be disposed in the display area 110. The display area 110 may be configured to display an image based on light emitted from the pixels 240. The display area 110 may be stretchable. For example, the display area 110 may be expanded or contracted without damage thereto. The display area 110 may include a plurality of display stretchable units 200 for accommodating stretching of the display area 110.

The display stretchable unit 200 may be a basic stretchable unit of the display area 110. The display stretchable unit 200 may include a first island 210, a first bridge 220, and a first cut-out groove 230.

A plurality of first islands 210 may be disposed in the display area 110, and the first islands 210 may be spaced apart from each other. The pixel 240 may be disposed on the first island 210. The pixel 240 may include a first sub-pixel 241, a second sub-pixel 242, and a third sub-pixel 243. For example, the first sub-pixel 241, the second sub-pixel 242, and the third sub-pixel 243 may be a red sub-pixel, a green sub-pixel, and a blue sub-pixel, respectively. A pixel circuit for driving the pixel 240, etc. may be further disposed on the first island 210.

In an exemplary embodiment of the present disclosure, one pixel 240, including the first sub-pixel 241, the second sub-pixel 242, and the third sub-pixel 243, may be disposed on each of the first islands 210. However, the present invention is not limited thereto, and one sub-pixel of the first sub-pixel 241, the second sub-pixel 242, and the third sub-pixel 243 may be disposed on each of the first islands 210.

A plurality of first bridges 220 may be disposed in the display area 110, and each of the first bridges 220 may connect adjacent first islands 210. For example, the first bridge 220 may connect two first islands 210 adjacent to each other.

In an exemplary embodiment of the present disclosure, four first bridges 220 may extend from a first island 210, and the first island 210 may be connected to four adjacent first islands 210 through the four first bridges 220, respectively. However, the present invention is not limited thereto, and a first island 210 may also be connected to two, three, five, or more adjacent first islands 210 through the first bridges 220.

Wirings connecting the pixels 240 respectively disposed on the first islands 210 may be disposed on the first bridges 220. The pixel 240 disposed on the first island 210 may receive driving signals, power voltages, etc. from the wirings disposed on the first bridges 220, and may be driven thereby.

A plurality of first cut-out grooves 230 may be formed in the display area 110. Each of the first cut-out grooves 230 may be formed between the first islands 210, between the first bridges 220, and between the first island 210 and the first bridge 220.

In an exemplary embodiment of the present disclosure, the first cut-out groove 230 may have an uppercase letter 'H' shape (e.g. a barbell shape). For example, the first cut-out groove 230 may have an uppercase letter 'H' shape in which a center portion extends along a first direction D1 or a second direction D2 perpendicular to the first direction D1. However, the present invention is not limited thereto, and the first cut-out groove 230 may have various shapes such as a dumbbell shape, a circular shape, a cross shape, a polygonal shape, etc.

When external force is applied to the display area 110, the display area 110 may be stretched as a shape of the display stretchable unit 200 is changed. For example, the display area 110 may be stretched as a shape and/or a size of the first cut-out groove 230 is changed. For example, a shape and/or a size of the first island 210 may be substantially maintained, and a location and/or an orientation of the first island 210 may be changed. Accordingly, the pixel 240 disposed on the first island 210 may be substantially free from distortion and may be resistant to significant breakage regardless of how the display area 110 is stretched, and an image displayed on the display area 110 may also be maintained.

Figure 3:
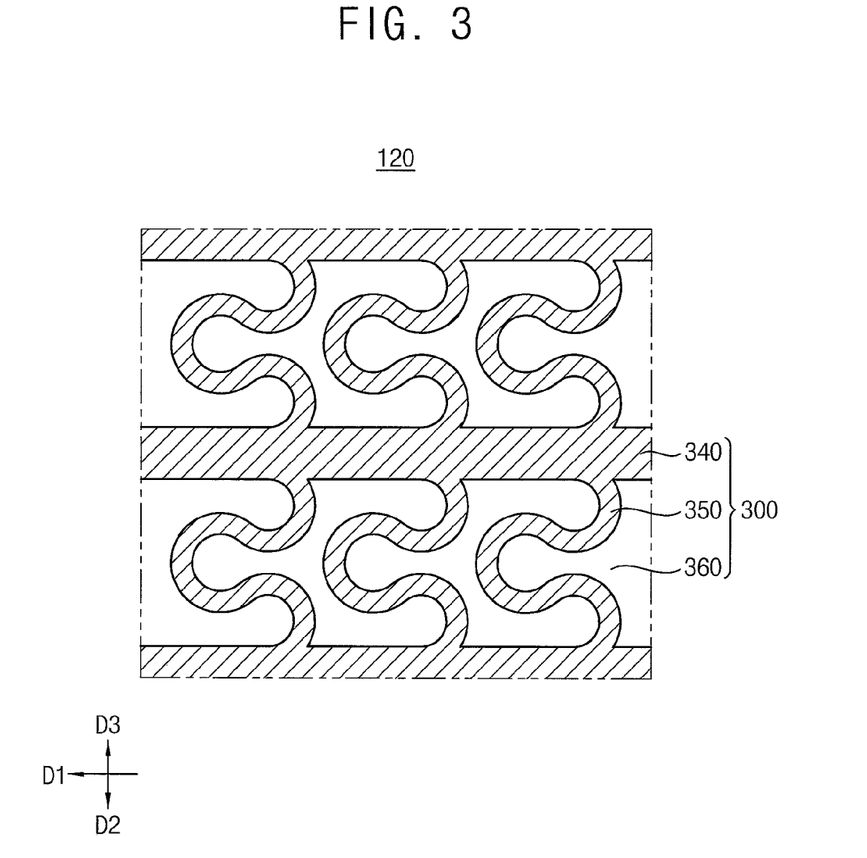
FIG. 3 is a plan view illustrating a first peripheral area in the stretchable display device of FIG. 1.

FIG. 3 is a plan view illustrating the first peripheral area 120 in the stretchable display device of FIG. 1.

Referring to FIGS. 1 and 3, the first peripheral area 120 may be disposed in the first direction D1 from the display area 110. For example, the first peripheral area 120 may be disposed at a left side and/or a right side of the display area 110 in a plan view. Driver circuits and power supply wirings may be disposed in the first peripheral area 120. For example, the driver circuits may include a scan (or gate) driver circuit, an emission control driver circuit, etc., and the power supply wirings may include a common power supply wiring. In an exemplary embodiment of the present disclosure, the driver circuits may be disposed in a portion of the first peripheral area 120 which is adjacent to the display area 110, and the power supply wirings may be disposed in a portion of the first peripheral area 120 which is spaced apart from the display area 110. The driver circuits may supply the driving signals to the pixels 240 disposed in the display area 110, and the power supply wirings may supply the power voltages to the pixels 240. Accordingly, the first peripheral area 120 may be a non-display area in which no image is displayed.

The first peripheral area 120 may be stretchable. For example, the first peripheral area 120 may be expanded or contracted. The first peripheral area 120 may include a plurality of peripheral stretchable units 300 for stretching of the first peripheral area 120.

The peripheral stretchable unit 300 may be a basic stretchable unit of the first peripheral area 120. The peripheral stretchable unit 300 may include a first line 340, a first connecting portion 350, and a first opening portion 360.

Elements such as the pixel 240, the pixel circuit, etc. may be disposed in the display area 110, and elements such as the driver circuits, the power supply wirings, etc. may be disposed in the first peripheral area 120, so that different elements may be disposed in the display area 110 and the first peripheral area 120. Accordingly, the peripheral stretchable unit 300 formed in the first peripheral area 120 may have a shape that is different from a shape of the display stretchable unit 200 formed in the display area 110.

A plurality of first lines 340 may be disposed in the first peripheral area 120. The first lines 340 may extend primarily along the first direction D1, and may be spaced apart from each other in the second direction D2. Multiple driving circuits may be disposed on the first line 340. For example, the driving circuits may include a scan (gate) driving circuit, an emission control driving circuit, etc.

In an exemplary embodiment of the present disclosure, two driving circuits may be disposed on each of the first lines 340. For example, the two driving circuits may be disposed in two rows on each of the first lines 340. The driving circuits may be electrically connected to pixel rows, respectively, and may supply the driving signals to the pixel rows. Therefore, one first line 340 may correspond to two pixel rows in the display area 110.

A plurality of first connecting portions 350 may be disposed in the first peripheral area 120, and each of the first connecting portions 350 may connect first lines 340 adjacent to each other. For example, the first connecting portion 350 may connect two first lines 340 adjacent to each other in the second direction D2. In an exemplary embodiment of the present disclosure, a plurality of first connecting portions 350 may be disposed between adjacent two first lines 340 to connect the adjacent two first lines 340.

The first connecting portion 350 may be curved and elongated to have a winding shape. For example, the first connecting portion 350 may have a shape similar to a continuous letter 'S' or another serpentine pattern. Since the first connecting portion 350 has the winding shape, when external force is applied to the first peripheral area 120, the first connecting portion 350 may be easily expanded or contracted so that the first peripheral area 120 may be stretched.

Wirings connecting the driving circuits respectively disposed on the first lines 340 may be disposed on the first connecting portion 350. The driving circuit disposed on the first line 340 may receive control signals, etc. through the wirings disposed on the first connecting portion 350, and may be driven thereby.

A plurality of first opening portions 360 may be formed in the first peripheral area 120. Each of the first opening portions 360 may be formed between the first lines 340, between the first connecting portions 350, and between the first line 340 and the first connecting portion 350.

When external force is applied to the first peripheral area 120, the first peripheral area 120 may be stretched such that a shape of the peripheral stretchable unit 300 is changed. For example, the first peripheral area 120 may be stretched such that a shape of the first connecting portion 350 and a shape and/or a size of the first opening portion 360 are changed. For example, a shape and/or a size of the first line 340 may be substantially maintained, and a location of the first line 340 may be changed. Accordingly, the driving circuits disposed on the first line 340 may be substantially maintained without significant breakage regardless of stretching of the first peripheral area 120.

Figure 4:
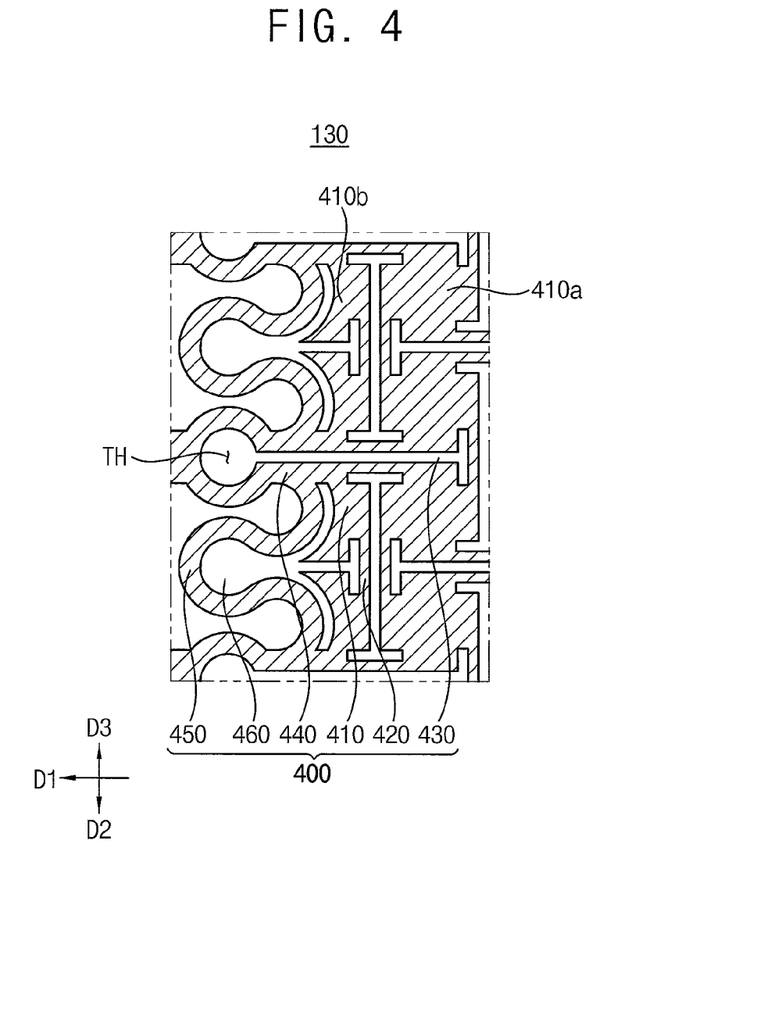
FIG. 4 is a plan view illustrating a buffer area in the stretchable display device of FIG. 1.
Figure 5:
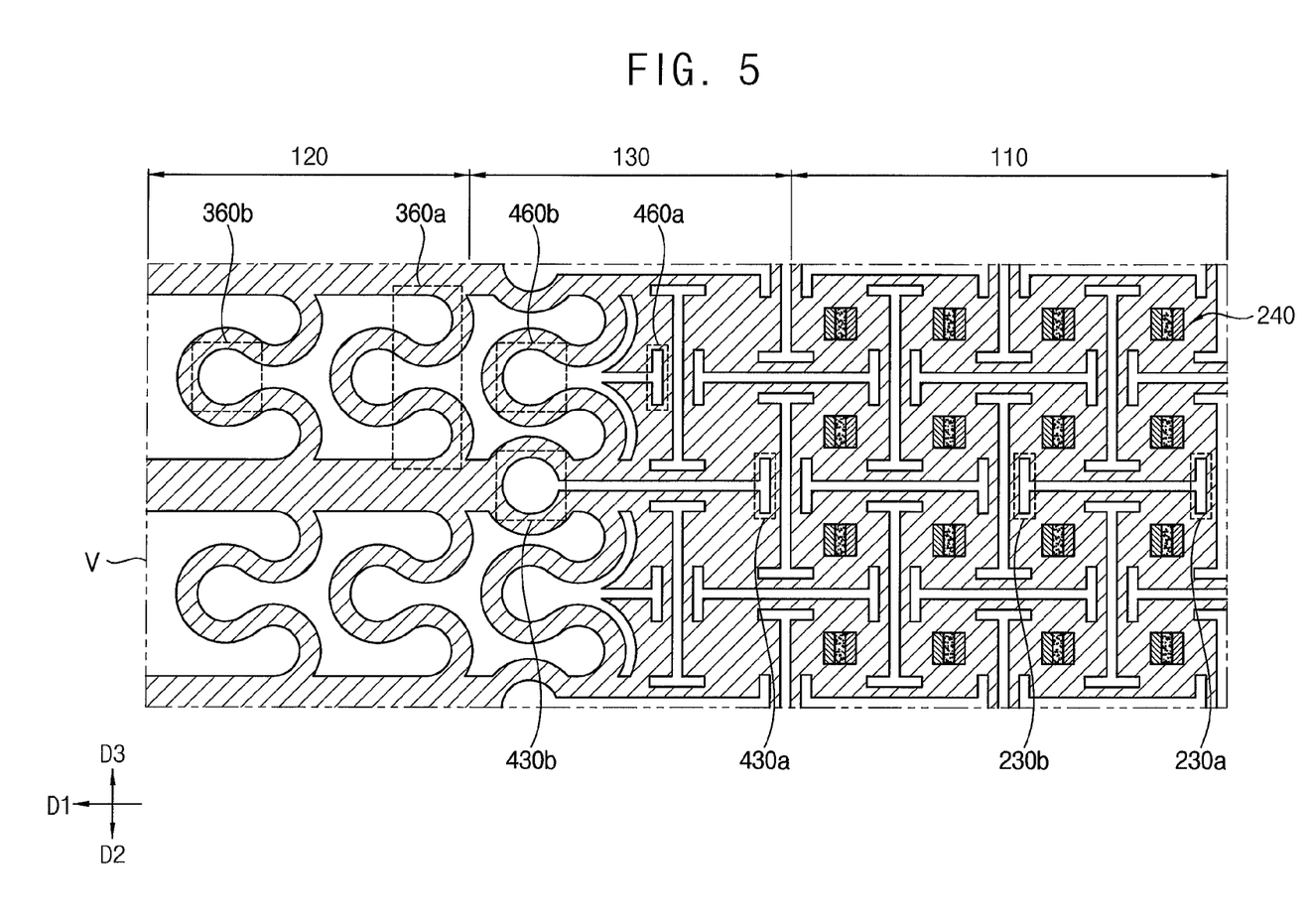
FIG. 5 is a plan view illustrating an area V in the stretchable display device of FIG. 1.
Figure 6:
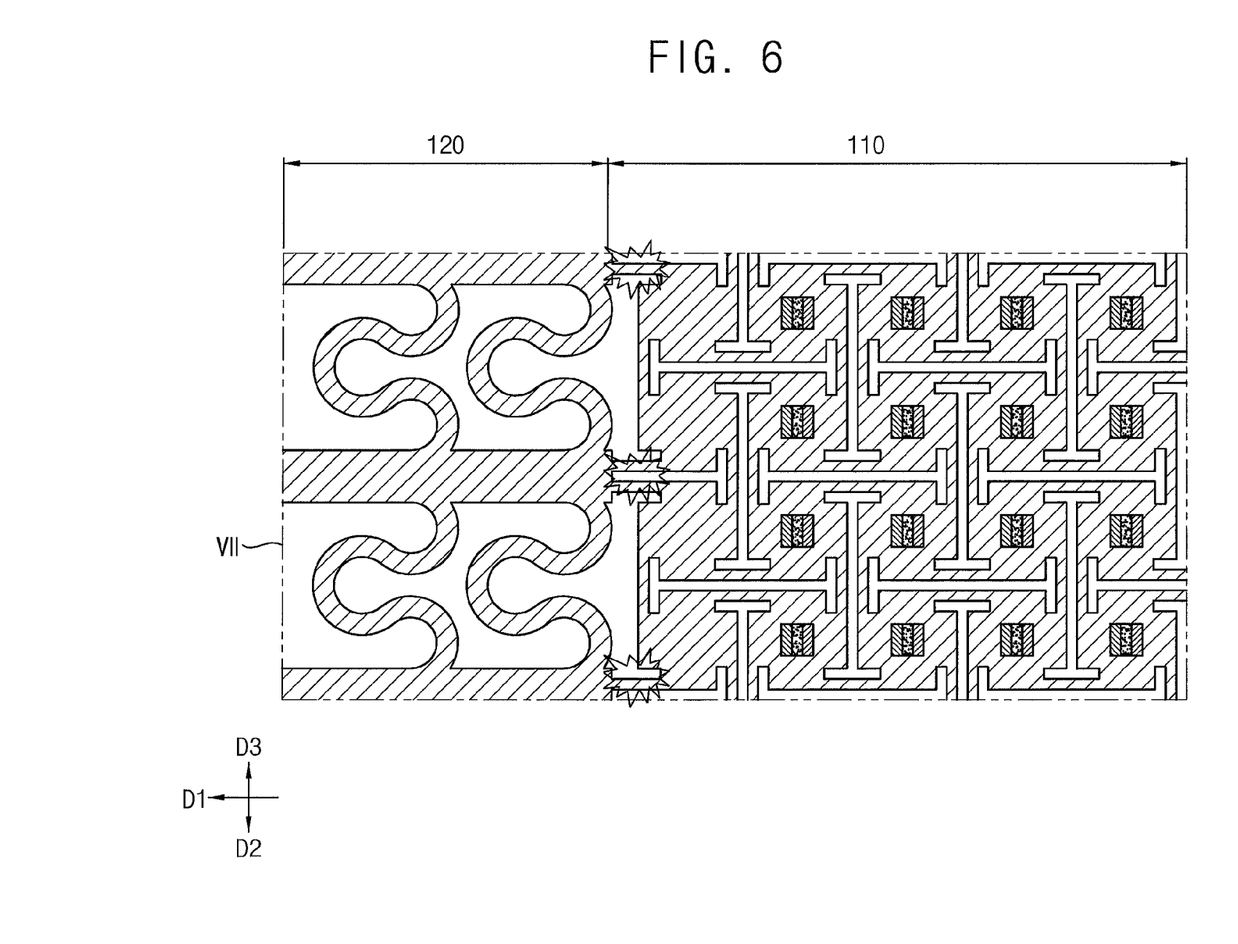
FIG. 6 is a plan view illustrating a stretchable display device according to a comparative example.

FIG. 4 is a plan view illustrating the buffer area 130 in the stretchable display device in FIG. 1. FIG. 5 is a plan view illustrating an area V in the stretchable display device in FIG. 1. FIG. 6 is a plan view illustrating a stretchable display device according to a comparative example.

Referring to FIGS. 1, 4, and 5, the buffer area 130 may be disposed between the display area 110 and the first peripheral area 120. For example, the buffer area 130 may be disposed between the display area 110 and a first peripheral area 120 located at a left side of the display area 110 in a plan view and/or between the display area 110 and a first peripheral area 120 located at a right side of the display area 110 in a plan view. The pixels 240 may be omitted from the buffer area 130. Therefore, the buffer area 130 may be a non-display area in which no image is displayed.

The buffer area 130 may be stretchable. For example, the buffer area 130 may be expanded or contracted without significant cracking or breakage. The buffer area 130 may include a plurality of buffer stretchable units 400 for stretching of the buffer area 130.

The buffer stretchable unit 400 may be a basic stretchable unit of the buffer area 130 that is repeated with periodicity. The buffer stretchable unit 400 may include a second island 410, a second bridge 420, a second cut-out groove 430, a second line 440, a second connecting portion 450, and a second opening portion 460.

As mentioned above, the peripheral stretchable unit 300 formed in the first peripheral area 120 and the display stretchable unit 200 formed in the display area 110 may have different shapes from each other. The different shape may be a different shape of the respective islands, the respective bridges, and/or the respective openings. Therefore, an elongation rate of the display area 110 and an elongation rate of the first peripheral area 120 may be different. As used herein, the phrase "elongation rate" describes a propensity to stretch under a pulling pressure. Thus, an area with a higher elongation rate may experience a more significant deformation than an area with a lower elongation rate.

As illustrated in FIG. 6, when a display area 110 and a first peripheral area 120 having different elongation rates are in contact with each other in a comparative example, stress may concentrate on a boundary between the display area 110 and the first peripheral area 120 so that a display stretchable unit and/or a peripheral stretchable unit may be damaged. For example, the stress may concentrate on first bridges of the display stretchable unit located at the boundary between the display area 110 and the first peripheral area 120 so that the first bridges may be damaged. To prevent this, according to exemplary embodiments of the present disclosure, the buffer area 130 including the buffer stretchable unit 400 having a different shape from those of the display stretchable unit 200 and the peripheral stretchable unit 300 may be disposed between the display area 110 and the first peripheral area 120.

A plurality of second islands 410 may be disposed in the buffer area 130, and the second islands 410 may be spaced apart from each other. The pixel 240 may be omitted from the second island 410.

In an exemplary embodiment of the present disclosure, the second islands 410 may include second islands 410a and 410b having different shapes from each other. For example, a second island 410a closer to the display area 110 and a second island 410b closer to the first peripheral area 120 may have different shapes from each other. For example, a shape of the second island 410a closer to the display area 110 may be substantially the same as a shape of the first island 210, and a shape of the second island 410b closer to the first peripheral area 120 may be different from the shape of the first island 210. For example, a size of the second island 410b closer to the first peripheral area 120 may be less than a size of the first island 210.

A plurality of second bridges 420 may be disposed in the buffer area 130, and each of the second bridges 420 may connect second islands 410 adjacent to each other. In an exemplary embodiment of the present disclosure, the second bridge 420 may further connect the second island 410 and the second line 440.

A plurality of second cut-out grooves 430 may be formed in the buffer area 130. Each of the second cut-out grooves 430 may be formed between the second islands 410, between the second bridges 420, and between the second island 410 and the second bridge 420.

A shape of the second cut-out groove 430 may be different from a shape of the first cut-out groove 230 and a shape of the first opening portion 360. In an exemplary embodiment of the present disclosure, the second cut-out groove 430 may have a portion partially similar to the first cut-out groove 230 and another portion partially similar to the first opening portion 360.

The first cut-out groove 230 may include a first end 230*a* and a second end 230*b* disposed in the first direction D1 from the first end 230*a*, and the second cut-out groove 430 may include a first end 430*a* and a second end 430*b* disposed in the first direction D1 from the first end 430*a*. The first opening portion 360 may include a first end 360*a* and a second end 360*b* disposed in the first direction D1 from the first end 360*a*.

In an exemplary embodiment of the present disclosure, the first end 230*a* and the second end 230*b* of the first cut-out groove 230 may have symmetrical shapes in the first direction D1, however, the first end 430*a* and the second end 430*b* of the second cut-out groove 430 may have asymmetrical shapes in the first direction D1.

In an exemplary embodiment of the present disclosure, a shape of the second end 430*b* of the second cut-out groove 430 may be different from a shape of the second end 230*b* of the first cut-out groove 230. For example, the second end 430*b* of the second cut-out groove 430 may have a circular shape, and the second end 230*b* of the first cut-out groove 230 may have a quadrilateral shape.

In an exemplary embodiment of the present disclosure, the shape of the second end 430*b* of the second cut-out groove 430 may be substantially the same as a shape of the second end 360*b* of the first opening portion 360. For example, each of the second end 430*b* of the second cut-out groove 430 and the second end 360*b* of the first opening portion 360 may have a circular shape.

In an exemplary embodiment of the present disclosure, a shape of the first end 430*a* of the second cut-out groove 430 may be substantially the same as a shape of the first end 230*a* of the first cut-out groove 230. For example, each of the first end 430*a* of the second cut-out groove 430 and the first end 230*a* of the first cut-out groove 230 may have a quadrilateral shape.

A plurality of second lines 440 may be disposed in the buffer area 130. The second lines 440 may extend primarily along the first direction D1, and may be spaced apart from each other along the second direction D2. The second lines 440 may be connected to the first lines 340 in the first peripheral area 120, respectively. Wirings connecting the driving circuit disposed on the first line 340 to the pixels 240 in the display area 110 may be disposed on the second line 440. The driving circuit may transmit the driving signals to the pixels 240 through the wirings disposed on the second line 440.

In an exemplary embodiment of the present disclosure, a shape of the second line 440 may be different from a shape of the first line 340. For example, the second line 440 may include a through hole TH disposed therethrough, however, the first line 340 might not include a through hole disposed therein. The through hole TH formed in the second line 440 may form a portion of the second cut-out groove 430. For example, the through hole TH may correspond to the second end 430*b* of the second cut-out groove 430.

A plurality of second connecting portions 450 may be disposed in the buffer area 130, and each of the second connecting portions 450 may connect second lines 440 adjacent to each other. For example, the second connecting portion 450 may connect two second lines 440 adjacent to each other in the second direction D2. In an exemplary embodiment of the present disclosure, one second connecting portion 450 may be disposed between adjacent two second lines 440 to connect the adjacent two second lines 440.

In an exemplary embodiment of the present disclosure, a shape of the second connecting portion 450 may be substantially the same as a shape of the first connecting portion 350. Therefore, the second connecting portion 450 may be curved and elongated to have a winding shape like the first connecting portion 350. For example, the second connecting portion 450 may have a continuous letter 'S' shape or some other serpentine pattern. Wirings may be disposed on the second connecting portion 450.

A plurality of second opening portions 460 may be formed in the buffer area 130. Each of the second opening portions 460 may be formed between the second lines 440 and between the second island 410 and the second connecting portion 450.

A shape of the second opening portion 460 may be different from a shape of the first opening portion 360 and a shape of the first cut-out groove 230. In an exemplary embodiment of the present disclosure, the second opening portion 460 may have a portion partially similar to the first opening portion 360 and another portion partially similar to the first cut-out groove 230.

The first cut-out groove 230 may include the first end 230*a* and the second end 230*b*, and the first opening portion 360 may include the first end 360*a* and the second end 360*b*. The second opening portion 460 may include a first end 460*a* and a second end 460*b* disposed in the first direction D1 from the first end 460*a*.

In an exemplary embodiment of the present disclosure, a shape of the first end 460*a* of the second opening portion 460 may be different from a shape of the first end 360*a* of the first opening portion 360. For example, the first end 460*a* of the second opening portion 460 may have a quadrilateral shape, and the first end 360*a* of the first opening portion 360 may have a shape in which two circles are spaced apart from each other in the second direction D2.

In an exemplary embodiment of the present disclosure, the shape of the first end 460*a* of the second opening portion 460 may be substantially the same as a shape of the first end 230*a* of the first cut-out groove 230. For example, each of the first end 460*a* of the second opening portion 460 and the first end 230*a* of the first cut-out groove 230 may have a quadrilateral shape.

In an exemplary embodiment of the present disclosure, a shape of the second end 460*b* of the second opening portion 460 may be substantially the same as a shape of the second end 360*b* of the first opening portion 360. For example, each of the second end 460*b* of the second opening portion 460 and the second end 360*b* of the first opening portion 360 may have a circular shape.

When external force is applied to the buffer area 130, the buffer area 130 may be stretched with a shape of the buffer stretchable unit 400 is changed. Since the buffer area 130, which includes the buffer stretchable unit 400 having a shape that is different from those of the display stretchable unit 200 and the peripheral stretchable unit 300, is disposed between the display area 110 and the first peripheral area 120 having different elongation rates, stress that can be concentrated between the display area 110 and the first peripheral area 120 due to difference of the elongation rates may be dispersed. For example, the buffer stretchable units 400 may disperse stress between the display area 110 and the first peripheral area 120. Therefore, the buffer area 130 may serve as a buffer between the display area 110 and the first peripheral area 120 and may therefore protect the display area 110 from damage.

Figure 7:
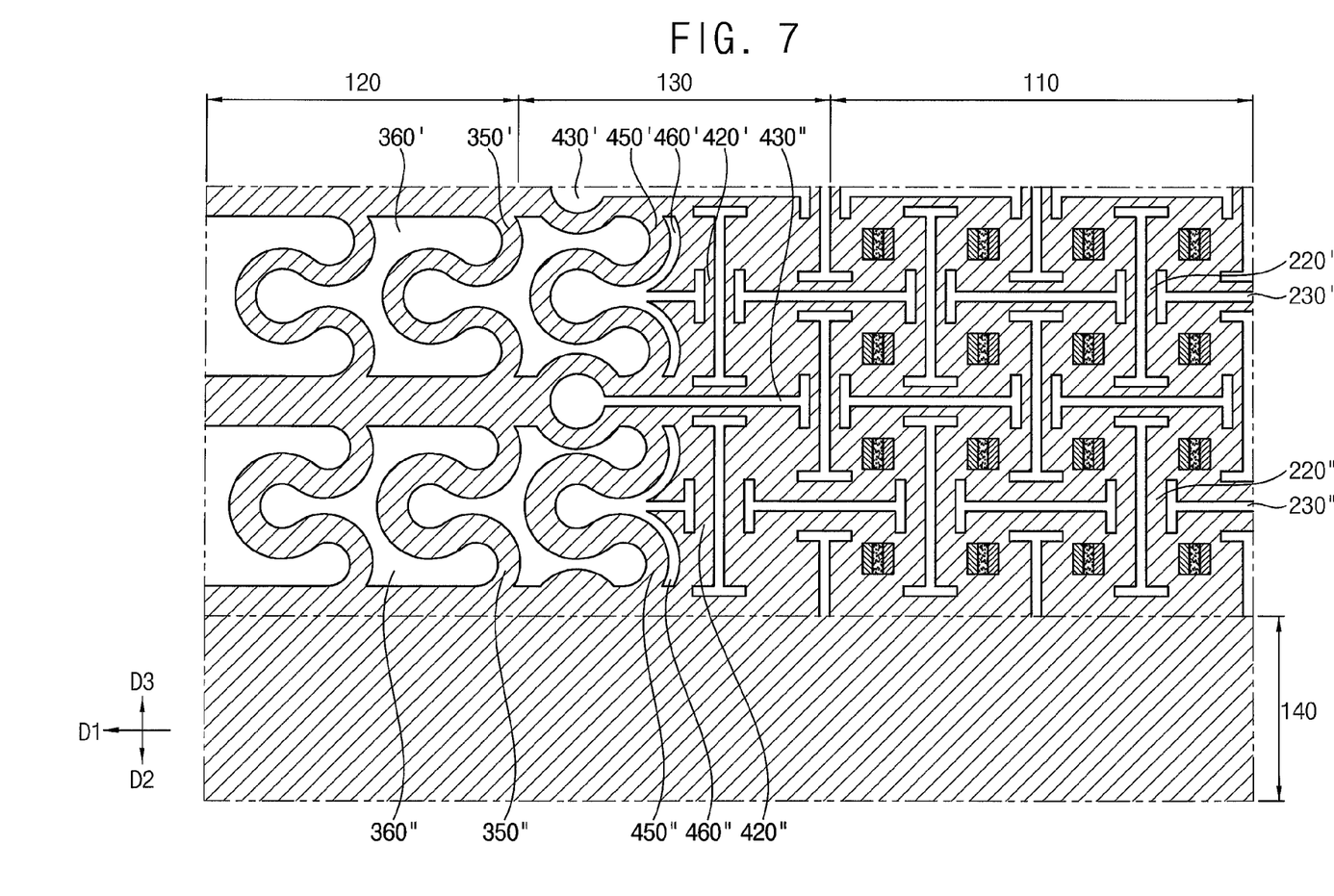
FIG. 7 is a plan view illustrating an area VII in the stretchable display device of FIG. 1.

FIG. 7 is a plan view illustrating an area VII in the stretchable display device in FIG. 1.

Referring to FIGS. 1 and 7, the second peripheral area 140 may be disposed in the second direction D2 from the display area 110, the first peripheral area 120, and the buffer area 130. For example, the second peripheral area 140 may be disposed at lower sides of the display area 110, the first peripheral area 120, and the buffer area 130 in a plan view. Pads and fan-out wirings may be disposed in the second peripheral area 140. For example, the pads may be connected to a printed circuit board including a data driver circuit, etc., and the fan-out wirings may be connected to the pads, so that data signals may be transmitted to the pixels 240 in the display area 110. Accordingly, the second peripheral area 140 may be a non-display area in which no image is displayed.

The second peripheral area 140 may be non-stretchable (e.g. resistant to stretching) to protect elements located in the second peripheral area 140. For example, the second peripheral area 140 might substantially retain its shape under exposure to a stretching or compressive force. The second peripheral area 140 might not include the stretchable units 200, 300, and 400 different from the display area 110, the first peripheral area 120, and the buffer area 130. Therefore, the second peripheral area 140 may have an elongation rate that is less than those of the display area 110, the first peripheral area 120, and the buffer area 130.

When the display area 110, the first peripheral area 120, and the buffer area 130 which have relatively high elongation rates are in contact with the second peripheral area 140 that has a relatively low elongation rate, the stretchable units 200, 300, and 400 may be damaged at boundaries between the display area 110 and the second peripheral area 140, between the first peripheral area 120 and the second peripheral area 140, and between the buffer area 130 and the second peripheral area 140. To prevent this, in portions of the display area 110, the first peripheral area 120, and the buffer area 130 which are adjacent to the second peripheral area 140, shapes of the display stretchable unit 200, the peripheral stretchable unit 300, and/or the buffer stretchable unit 400 may be changed according to distances from the second peripheral area 140.

In an exemplary embodiment of the present disclosure, sizes of the first cut-out grooves 230 and sizes of the second cut-out grooves 430 may decrease closer to the second peripheral area 140. As illustrated in FIG. 7, a size of a first cut-out groove 230" relatively close to the second peripheral area 140 may be less than a size of a first cut-out groove 230' relatively far from the second peripheral area 140, and a size of a second cut-out groove 430" relatively close to the second peripheral area 140 may be less than a size of a second cut-out groove 430' relatively far from the second peripheral area 140.

In an exemplary embodiment of the present disclosure, sizes of the first opening portions 360 and sizes of the second opening portions 460 may decrease closer to the second peripheral area 140. As illustrated in FIG. 7, a size of a first opening portion 360" relatively close to the second peripheral area 140 may be less than a size of a first opening portion 360' relatively far from the second peripheral area 140, and a size of a second opening portion 460" relatively close to the second peripheral area 140 may be less than a size of a second opening portion 460' relatively far from the second peripheral area 140.

In an exemplary embodiment of the present disclosure, widths of the first bridges 220 and widths of the second bridges 420 may increase closer to the second peripheral area 140. As illustrated in FIG. 7, a width of a first bridge 220" relatively close to the second peripheral area 140 may be greater than a width of a first bridge 220' relatively far from the second peripheral area 140, and a width of a second bridge 420" relatively close to the second peripheral area 140 may be greater than a size of a second bridge 420' relatively far from the second peripheral area 140.

In an exemplary embodiment of the present disclosure, widths of the first connecting portions 350 and widths of the second connecting portions 450 may increase closer to the second peripheral area 140. As illustrated in FIG. 7, a width of a first connecting portion 350" relatively close to the second peripheral area 140 may be greater than a width of a first connecting portion 350' relatively far from the second peripheral area 140, and a width of a second connecting portion 450" relatively close to the second peripheral area 140 may be greater than a width of a second connecting portion 450' relatively far from the second peripheral area 140.

Figure 8:
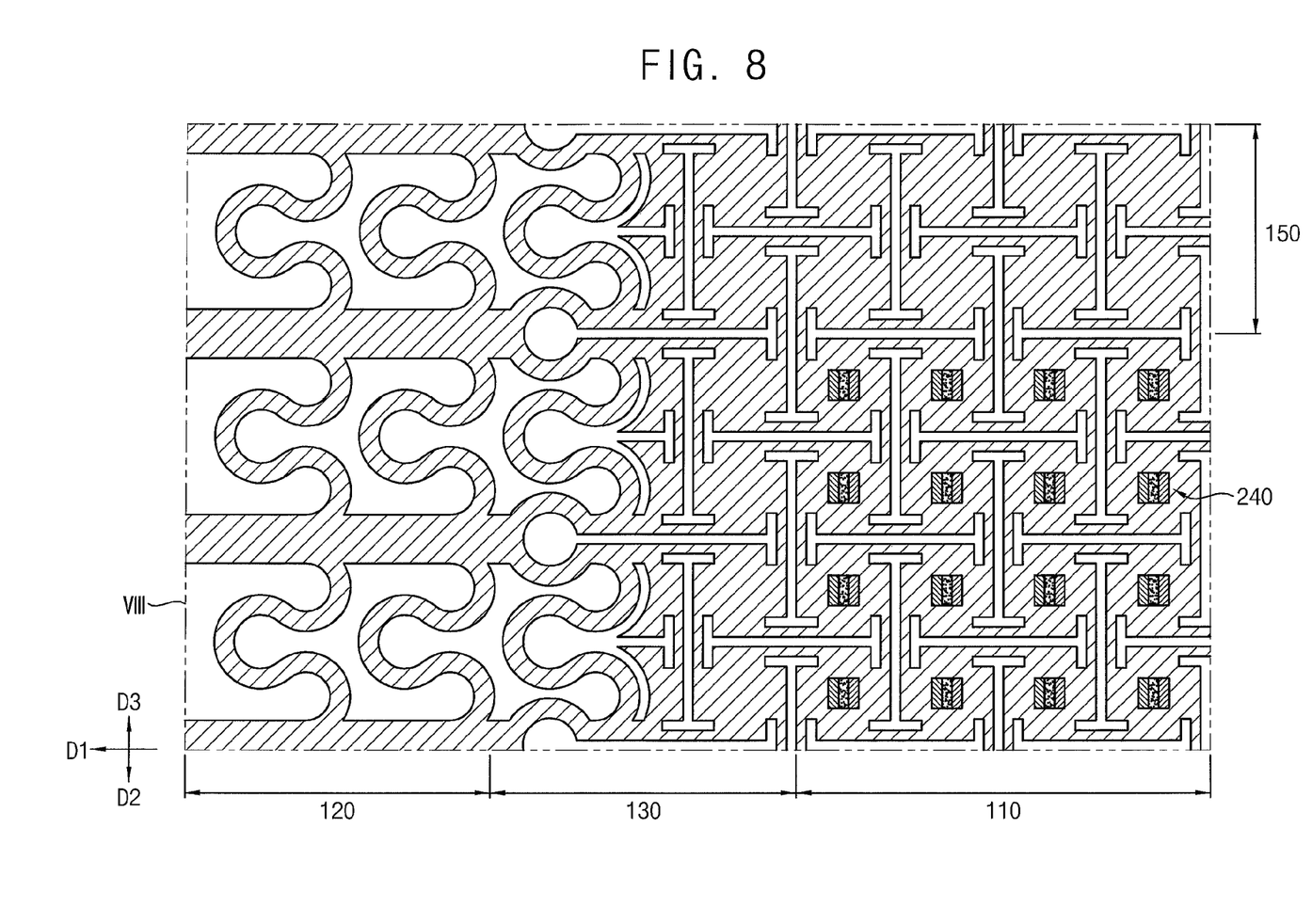
FIG. 8 is a plan view illustrating an area VIII in the stretchable display device of FIG. 1.

FIG. 8 is a plan view illustrating an area VIII in the stretchable display device of FIG. 1.

Referring to FIGS. 1 and 8, the third peripheral area 150 may be disposed in a third direction D3 opposite to the second direction D2 from the display area 110, the first peripheral area 120, and the buffer area 130. For example, the third peripheral area 150 may be disposed at an upper side of the display area 110, the first peripheral area 120, and the buffer area 130 in a plan view. The third peripheral area 150 may include the stretchable units 200, 300, and 400 similar to the display area 110, the first peripheral area 120, and the buffer area 130. For example, the third peripheral area 150 may include the stretchable units 200, 300, and 400 different from the second peripheral area 140 that does not include the stretchable units 200, 300, and 400, so that the third peripheral area 150 may be stretchable. Therefore, the third peripheral area 150 may have an elongation rate that is greater than that of the second peripheral area 140.

Pixels may be omitted from the display stretchable units 200 located in the third peripheral area 150, and driving circuits may be omitted from the peripheral stretchable units 300 located in the third peripheral area 150. Accordingly, the third peripheral area 150 may be a non-display area that does not display an image.

End portions of the display area 110, the first peripheral area 120, and the buffer area 130 in the second direction D2 may be in contact with the second peripheral area 140 that has a relatively low elongation rate, however, end portions of the display area 110, the first peripheral area 120, and the buffer area 130 in the third direction D3 may be in contact with the third peripheral area 150 that has a relatively high elongation rate. Therefore, in portions of the display area 110, the first peripheral area 120, and the buffer area 130 which are adjacent to the third peripheral area 150, shapes of the display stretchable unit 200, the peripheral stretchable unit 300, and the buffer stretchable unit 400 might not be changed and uniformed according to distances from the third peripheral area 150.

Figure 9:
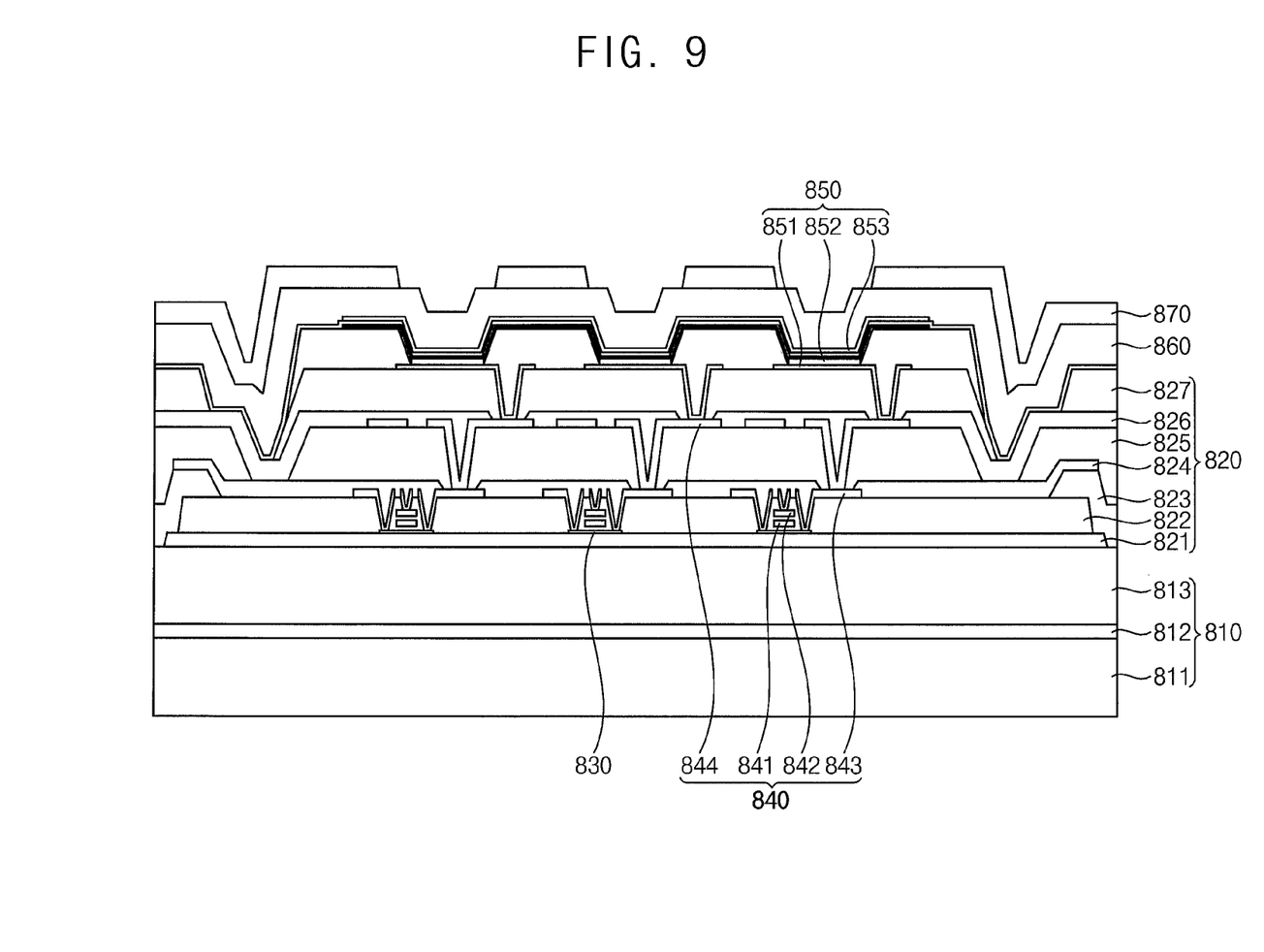
FIG. 9 is a cross-sectional view illustrating a portion of the stretchable display device of FIG. 1.

FIG. 9 is a cross-sectional view illustrating a portion of the stretchable display device in FIG. 1. For example, FIG. 9 may be a cross-sectional view illustrating the first island 210 of the display stretchable unit 200.

Referring to FIG. 9, a stretchable display device according to an exemplary embodiment of the present disclosure may include a substrate 810, a plurality of insulation layers 820, a semiconductor layer 830, a plurality of conductive layers 840, light emitting elements 850, and an encapsulation layer 860. In an exemplary embodiment of the present disclosure, the stretchable display device may further include a black matrix 870.

The substrate 810 may include the display area 110, the first peripheral area 120, the buffer area 130, the second peripheral area 140, and the third peripheral area 150. In addition, the substrate 810 may have a multilayer structure in which a plurality of layers 811, 812, and 813 are stacked. For example, the substrate 810 may have a multilayer structure in which a first substrate layer 811, a barrier layer 812, and a second substrate layer 813 are stacked. The first substrate layer 811 and the second substrate layer 813 may be formed of an organic material such as polyimide (PI), etc., and the barrier layer 812 may be formed of an inorganic material such as silicon oxide, silicon nitride, amorphous silicon, etc.

The semiconductor layer 830 and the conductive layers 840 may be disposed on the substrate 810. The semiconductor layer 830 may be disposed on the substrate 810, and the conductive layers 840 may be disposed on the semiconductor layer 830. The conductive layers 840 may include a first gate conductive layer 841, a second gate conductive layer 842, a first data conductive layer 843, and a second data conductive layer 844 which are sequentially stacked. The semiconductor layer 830 may be formed of polysilicon, an oxide semiconductor, etc., the first gate conductive layer 841 and the second gate conductive layer 842 may be formed of a metal having a relatively low resistance such as molybdenum (Mo), or a metal having a resistance similar to or less than Mo, etc., and the first data conductive layer 843 and the second data conductive layer 844 may be formed of a metal having a relatively high flexibility such as aluminum (Al), titanium (Ti), or a material having a flexibility similar to or more than Al or Ti, etc.

The insulation layers 820 may be disposed between the substrate 810, the semiconductor layer 830, and the conductive layers 840 over the substrate 810. The insulation layers 820 may include a buffer layer 821, a gate insulation layer/insulation interlayer 822, a first via insulation layer 823, a first protective layer 824, a second via insulation layer 825, and a second protective layer 826, and a third via insulation layer 827. The buffer layer 821, the gate insulation layer/insulation interlayer 822, the first protective layer 824, and the second protective layer 826 may be formed of an inorganic material such as silicon oxide, silicon nitride, etc., and the first via insulation layer 823, the second via insulation layer 825, and the third via insulation layer 827 may be formed of an organic material.

In an exemplary embodiment of the present disclosure, the aforementioned stretchable units 200, 300, and 400 may include the substrate 810. In an exemplary embodiment of the present disclosure, the stretchable units 200, 300, and 400 may further include the insulation layers 820. The first cut-out groove 230, the first opening portion 360, the second cut-out groove 430, and the second opening portion 460 may be in portions where the substrate 810 and the insulation layers 820 are penetrated. Accordingly, the stretchable units 200, 300, and 400 may be stretched with shapes and/or sizes of the first cut-out groove 230, the first opening portion 360, the second cut-out groove 430, and the second opening portion 460 are changed when external force is applied.

The light emitting elements 850 may be disposed on the insulation layers 820. In an exemplary embodiment of the present disclosure, the light emitting element 850 may be an organic light emitting element. For example, the light emitting element 850 may include a pixel electrode 851, an organic emission layer 852, and a common electrode 853.

The encapsulation layer 860 covering the light emitting elements 850 may be disposed thereon, and the black matrix 870 may be disposed on the encapsulation layer 860. The encapsulation layer 860 may at least partially cover the light emitting elements 850 to protect the light emitting elements 850, and the black matrix 870 may prevent reflection of external light. In an exemplary embodiment of the present disclosure, the encapsulation layer 860 may be formed of an inorganic layer. According to an exemplary embodiment of the present disclosure, the encapsulation layer 860 may include at least one inorganic layer and at least one organic layer.

Figure 10:
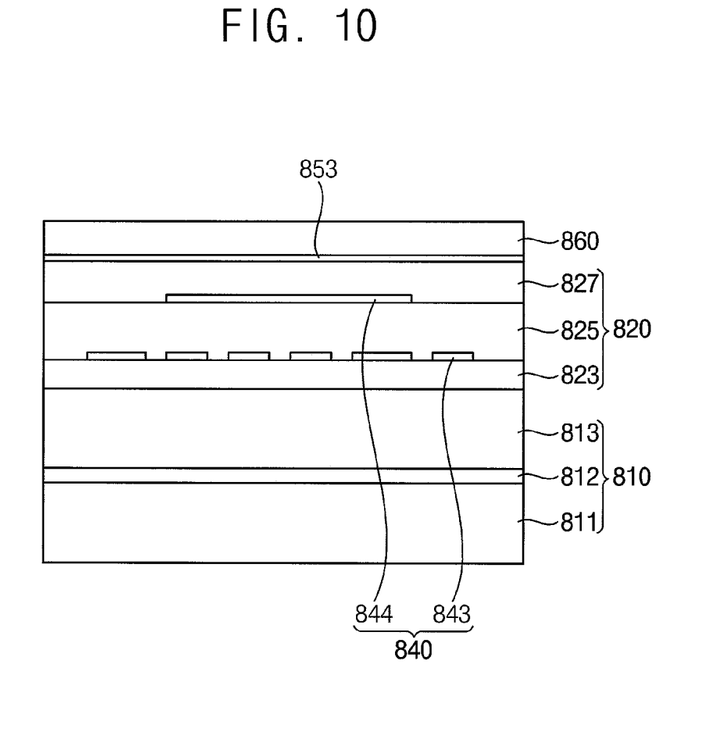
FIG. 10 is a cross-sectional view illustrating a portion of the stretchable display device of FIG. 1.

FIG. 10 is a cross-sectional view illustrating a portion of the stretchable display device in FIG. 1. For example, FIG. 10 may be a cross-sectional view illustrating the first bridge 220 of the display area 110, the first connecting portion 350 of the first peripheral area 120, or the buffer area 130.

Referring to FIG. 10, the insulation layers 820 located in the first bridge 220 of the display area 110, the first connecting portion 350 of the first peripheral area 120, and the buffer area 130 may include a plurality of organic layers 823, 825, and 827. For example, the organic layers 823, 825, and 827 may include the first via insulation layer 823, the second via insulation layer 825, and the third via insulation layer 827. Portions of the inorganic insulation layers 821, 822, 824, and 826 between the substrate 810 and the encapsulation layer 860 may be removed in the first bridge 220 of the display area 110, the first connecting portion 350 of the first peripheral area 120, and the buffer area 130. Accordingly, elongation rates of the first bridge 220 of the display area 110, the first connecting portion 350 of the first peripheral area 120, and the buffer area 130 may increase.

Wirings may be disposed on the first bridge 220 of the display area 110, the first connecting portion 350 of the first peripheral area 120, the second bridge 420 of the buffer area 130, and the second connecting portion 450 of the buffer area 130, and the wirings may be located between the organic layers 823, 825, and 827. In an exemplary embodiment of the present disclosure, each of the wirings may include at least one of the first data conductive layer 843 and the second data conductive layer 844. Accordingly, elongation rates of the first bridge 220 of the display area 110, the first connecting portion 350 of the first peripheral area 120, the second bridge 420 of the buffer area 130, and the second connecting portion 450 of the buffer area 130 may increase.

The stretchable display device, according to exemplary embodiments of the present disclosure, may be applied to an electronic device having a curved shape.

Although the stretchable display devices, according to exemplary embodiments of the present disclosure, have been described with reference to the drawings, it is to be understood that various modifications and changes may be made thereto without departing from the technical spirit described herein.

What is claimed is:

1. A stretchable display device, comprising:
a stretchable display area including a plurality of first islands on which a plurality of pixels are respectively disposed and a plurality of first cut-out grooves formed between the first islands;
a stretchable first peripheral area extending primarily in a first direction from the display area, the stretchable first peripheral area including a plurality of first lines on which a plurality of driving circuits are respectively disposed and a plurality of first opening portions formed between the first lines; and
a stretchable buffer area disposed between the display area and the stretchable first peripheral area, the stretchable buffer area including a plurality of second islands, a plurality of second cut-out grooves formed between the second islands, a plurality of second lines respectively connected to the second islands, and a plurality of second opening portions formed between the second lines,
wherein a shape of each of the first opening portions is different from a shape of each of the first cut-out grooves, and
wherein a shape of each of the second opening portions includes a first portion of the shape of each of the first opening portions and a first portion of the shape of each of the first cut-out grooves.

2. The stretchable display device of claim 1, wherein a shape of each of the second cut-out grooves includes a second portion of the shape of each of the first opening portions and a second portion of the shape of each of the first cut-out grooves.

3. The stretchable display device of claim 1, wherein each of the first cut-out grooves, each of the first opening portions, and each of the second cut-out grooves include a first end and a second end disposed across the first direction from the first end, and
wherein a shape of the second end of each of the second cut-out grooves is different from a shape of the second end of each of the first cut-out grooves.

4. The stretchable display device of claim 3, wherein a shape of the first end of each of the second cut-out grooves is substantially identical to a shape of the first end of each of the first cut-out grooves.

5. The stretchable display device of claim 3, wherein the shape of the second end of each of the second cut-out grooves is substantially identical to a shape of the second end of each of the first opening portions.

6. The stretchable display device of claim 3, wherein the first end and the second end of each of the first cut-out grooves have shapes that are symmetrical about the first direction, and
wherein the first end and the second end of each of the second cut-out grooves have shapes that are asymmetrical about the first direction.

7. The stretchable display device of claim 1, wherein each of the first cut-out grooves, each of the first opening portions, and each of the second opening portions include a first end and a second end disposed across the first direction from the first end, and
wherein a shape of the first end of each of the second opening portions is different from a shape of the first end of each of the first opening portions.

8. The stretchable display device of claim 7, wherein a shape of the second end of each of the second opening portions is substantially identical to a shape of the second end of each of the first opening portions.

9. The stretchable display device of claim 7, wherein the shape of the first end of each of the second opening portions is substantially identical to a shape of the first end of each of the first cut-out grooves.

10. The stretchable display device of claim 1, further comprising:
a non-stretchable second peripheral area extending primarily in a second direction perpendicular to the first direction from the first display area, the stretchable first peripheral area, and the stretchable buffer area.

11. The stretchable display device of claim 10, wherein sizes of the first cut-out grooves and sizes of the second cut-out grooves gradually decrease closer to the non-stretchable second peripheral area.

12. The stretchable display device of claim 10, wherein sizes of the first opening portions and sizes of the second opening portions gradually decrease closer to the non-stretchable second peripheral area.

13. The stretchable display device of claim 1, further comprising:
a substrate including the display area, the stretchable first peripheral area, and the stretchable buffer area;
a plurality of insulation layers stacked on the substrate; and
an encapsulation layer disposed on the insulation layers.

14. The stretchable display device of claim 13, wherein the first cut-out grooves, the first opening portions, the second cut-out grooves, and the second openings are disposed in areas where the insulation layers and the substrate are penetrated.

15. The stretchable display device of claim 13, wherein the insulation layers in the stretchable buffer area include a plurality of organic layers.

16. A stretchable display device, comprising:
a stretchable display area including a plurality of first islands on which a plurality of pixels are respectively disposed and a plurality of first cut-out grooves formed between the first islands;
a stretchable first peripheral area extending primarily in a first direction from the display area, the stretchable first peripheral area including a plurality of first lines on which a plurality of driving circuits are respectively disposed and a plurality of first opening portions formed between the first lines; and
a stretchable buffer area disposed between the display area and the stretchable first peripheral area, the stretchable buffer area including a plurality of second islands, a plurality of second cut-out grooves formed between the second islands, a plurality of second lines respectively connected to the second islands, and a plurality of second opening portions formed between the second lines,
wherein a shape of each of the first opening portions is different from a shape of each of the first cut-out grooves, and
wherein a shape of each of the second cut-out grooves includes a portion of the shape of each of the first opening portions and a portion of the shape of each of the first cut-out grooves.

* * * * *